United States Patent [19]

Hurley et al.

[11] Patent Number: 4,489,384
[45] Date of Patent: Dec. 18, 1984

[54] ELECTRO-OPTICAL SENSOR FOR WATT-HOUR METER

[75] Inventors: James R. Hurley, Brookfield; Clyde Gilker, Milwaukee, both of Wis.

[73] Assignee: McGraw-Edison Company, Rolling Meadows, Ill.

[21] Appl. No.: 353,476

[22] Filed: Mar. 1, 1982

[51] Int. Cl.$^3$ ............ G01R 27/26; G01R 11/36; G08C 19/36
[52] U.S. Cl. ............ 364/483; 250/231 SE; 324/137; 340/870.02; 340/870.29
[58] Field of Search ............ 364/480, 481, 483; 324/137; 250/231 SE; 340/870.02, 870.03, 870.29, 347 P

[56] References Cited

U.S. PATENT DOCUMENTS

| | | | |
|---|---|---|---|
| 2,883,622 | 4/1959 | Lenehan | 324/137 |
| 3,505,508 | 4/1970 | Leyde | 235/151.31 |
| 3,522,421 | 8/1970 | Miller | 235/151.21 |
| 3,551,810 | 12/1970 | Zisa et al. | 324/137 |
| 3,602,814 | 8/1971 | Quirk | 324/137 |
| 3,789,201 | 1/1974 | Carpenter et al. | 235/151.21 |
| 3,848,178 | 11/1974 | Marks | 323/6 |
| 4,002,976 | 1/1977 | Zulaski | 324/126 |
| 4,034,233 | 7/1977 | Leyde | 307/41 |
| 4,034,292 | 7/1977 | McClelland | 324/157 |
| 4,059,747 | 11/1977 | Brody | 364/493 |
| 4,075,699 | 2/1978 | Schneider et al. | 364/492 |
| 4,133,034 | 1/1979 | Etter | 364/464 |
| 4,157,507 | 6/1979 | Desai et al. | 328/134 |
| 4,213,119 | 6/1980 | Ward et al. | 340/151 |
| 4,240,030 | 12/1980 | Bateman et al. | 324/110 |
| 4,241,237 | 12/1980 | Paraskevakos et al. | 179/2 AM |
| 4,253,151 | 2/1981 | Bouve | 364/483 |
| 4,281,325 | 7/1981 | Jarva | 340/870.29 |
| 4,283,772 | 8/1981 | Johnston | 364/900 |
| 4,321,531 | 3/1982 | Marshall | 324/142 |
| 4,331,917 | 5/1982 | Render et al. | 324/166 |

FOREIGN PATENT DOCUMENTS

| | | | |
|---|---|---|---|
| WO81/03541 | 12/1981 | PCT Int'l Appl. | 364/483 |
| 0015666 | 2/1979 | United Kingdom . | |

Primary Examiner—Errol A. Krass
Assistant Examiner—Clifford L. Tager
Attorney, Agent, or Firm—Jon Carl Gealow; James A. Gabala; Thomas R. Vigil

[57] ABSTRACT

The electronic watt-hour meter (10) comprises an electro-optical watt-hour sensor (12) adapted to be coupled to a consumer's connection to a source of electric power for sensing voltage supplied to, and the current drawn by, the consumer's electric load and for producing output signals indicative of a quantity of watt-hours of power utilized by the consumer. In the meter (10) a microprocessor (22) is coupled to the sensor (12) for receiving output signals therefrom and a memory (29) is coupled to the microprocessor (22) for receiving and storing data. A power supply (24) supplies D.C. power to the microprocessor (22) and includes a clock signal generator to supply a 60 Hz. clock signal to the microprocessor (22). Also a visual display (30) is coupled to the microprocessor (22) for providing a readout of the power consumed since the last reading of the solid state watt-hour meter. The electro-optical sensor (12) includes a yoke (14) having a voltage core (62) and at least one current core (66 or 67), an induction disk (16) mounted for rotation in yoke (14), a voltage coil (64) in FIG. 1 on the voltage core (62) and a current loop (68 or 69) on the current core (66 or 67) for causing, when energized, rotation of the induction disk (16). At least one aperture (76) in FIG. 2 is provided in the disk (16). LED's (71 and 72), positioned on one side of the disk (16), are coupled to the microprocessor (22). Photosensors (81 and 82) are positioned on the other side of the disk (16) for receiving light passing therethrough and for generating an output signal which is supplied to a direction sensing and revolution counting circuit (90) in FIG. 2 for sensing the direction of rotation of the disk (16) and for supplying such information to the microprocessor (22). A power supply coil (26) is mounted on the yoke (14) for supplying A.C. voltage to the power supply (24).

4 Claims, 2 Drawing Figures

ELECTRO-OPTICAL SENSOR FOR WATT-HOUR METER

TECHNICAL FIELD

The present invention relates to an electronic watt-hour meter having an electro-optical watt-hour sensor, a solid state microprocessor and a power supply for the microprocessor operated off of a coil mounted in the sensor.

BACKGROUND ART

Heretofore various electronic watt-hour meters incorporating a microprocessor therein have been proposed. Such electronic watt-hour meters have provided for the monitoring of and the storing of information related to power demand and power use by a consumer. Also, such meters have included circuitry, programming and switches connected to various consumer loads for enabling the microprocessor to switch off or de-energize certain consumer loads during high electric use periods, e.g., daytime, and to switch on or energize these loads during low electric use periods, e.g., nighttime.

Examples of such previously proposed electronic watt-hour meters are disclosed in the following U.S. patents:

| U.S. PAT. NO. | PATENTEE |
| --- | --- |
| 3,505,508 | Leyde |
| 3,522,421 | Miller |
| 3,789,201 | Carpenter, et al. |
| 4,034,233 | Leyde |
| 4,059,747 | Brody |
| 4,075,699 | Schneider, et al. |
| 4,240,030 | Bateman, et al. |
| 4,241,237 | Paraskevakos, et al. |
| 4,253,151 | Bouve |

See also European Patent Application Publication No. 0015666 for: Apparatus for Controlling Electric Power Consumption, filed by South Eastern Electricity Board, Queens Gardens Hove, Sussex, England.

Moreover, a solid state watt-hour meter utilizing a Hall-effect sensor is disclosed in copending application Ser. No. 303,627 filed Sept. 18, 1981 and entitled Solid State Watt-Hour Meter, the disclosure of which is incorporated herein by reference.

Also, it has been proposed to modify a conventional watt-hour meter by providing a photocell positioned above apertures or notches in the rotating induction disk of the meter in U.S. Pat. No. 4,240,030.

As will be described in greater detail hereinafter, the electronic watt-hour meter of the present invention differs from the previously proposed electronic watt-hour meters by providing an electro-optical sensor with direction sensing circuitry. Also, a power supply for the microprocessor in the watt-hour meter is operated off a power supply coil mounted on the yoke of the electro-optical sensor.

Although systems for detecting direction of motion have been proposed, see for example U.S. Pat. No. 4,157,507, such a system has not been proposed for use in an electro-optical watt-hour sensor. Moreover, the particular sensing circuitry utilized in the sensor of the present invention is believed to be unique and novel, and is simple in design and inexpensive.

DISCLOSURE OF INVENTION

The electronic watt-hour meter of the present invention utilizes an electro-optical watt-hour sensor where light is passed through at least one slot in an induction disk during one revolution of the disk and picked up by a sensor to generate a signal which is supplied to a counter in or connected to a microprocessor. The sensor includes circuitry for sensing the direction of rotation of the disk mounted in a yoke of the sensor. Also, the electronic watt-hour meter of the present invention includes a power supply for supplying D.C. voltage to the microprocessor of the meter, the power supply including a power supply coil mounted on the yoke of an induction disk type watt-hour sensor.

According to the invention there is provided an electronic watt-hour meter comprising: an electro-optical watt-hour sensor adapted to be coupled to a consumer's connection to a source of electric power for sensing the voltage supplied to, and the current drawn by, the consumer's electric load and for producing output signals indicative of a quantity of watt-hours of power utilized by the consumer; a microprocessor coupled to said watt-hour sensor for receiving said output signals; memory means coupled to said microprocessor for receiving and storing data; power supply means for supplying D.C. power to said microprocessor; clock signal generating means coupled between the consumer line voltage and said microprocessor for supplying a 60 Hz clock signal to said microprocessor; and readout means coupled to said microprocessor for providing a readout of the power consumed since the last reading of said electronic watt-hour meter, said electro-optical sensor comprising a yoke having a voltage core and at least one current core, an induction disk mounted in said yoke, a voltage coil on said voltage core and a current loop on said at least one current core for causing, when energized, rotation of said induction disk, at least one aperture in said disk, light generating means on one side of said disk coupled to said microprocessor, light receiving means on the other side of said disk for receiving light passing through said aperture and for generating an output signal which is supplied to said microprocessor and direction sensing means coupled to said light receiving means for sensing the direction of rotation of said disk and for supplying such information to said microprocessor.

Also according to the invention there is provided an electric watt-hour meter comprising an induction disk type watt-hour sensor wherein an induction disk is mounted for rotation within a yoke, a microprocessor and a power supply for the microprocessor which includes a power supply coil mounted on the yoke of the sensor.

BEST MODE FOR CARRYING OUT THE INVENTION

Figure 1:
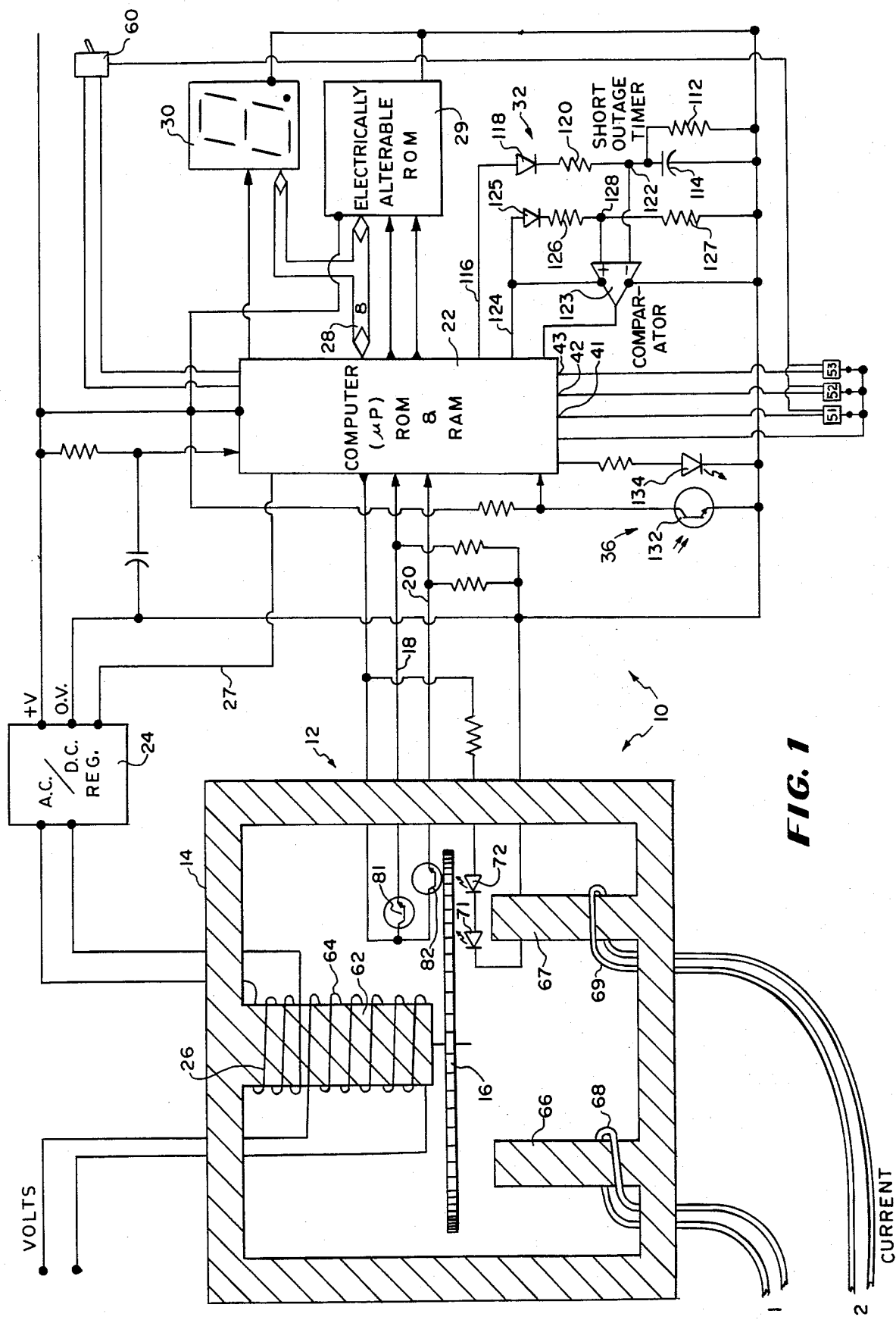
FIG. 1 is a schematic circuit diagram of the electrical circuit of the electronic watt-hour meter with an electro-optical sensor constructed according to the teachings of the present invention.

Referring now to FIG. 1 there is illustrated therein an electronic watt-hour meter 10. Briefly, the meter 10 comprises an electro-optical sensor 12 including a conventional yoke 14 with a modified induction disk 16 mounted for rotation therein.

Output lines 18 and 20 from the sensor 12 are coupled to a microprocessor 22 having built-in ROM and RAM and forming the "brain" of the meter 10. The ROM contains the operation program and decision center for the meter 10. The RAM is available for "scratchpad work".

The microprocessor 22 is supplied with +D.C. voltage from a regulated A.C. to D.C. power supply 24 which is powered by a power supply coil 26 mounted on the yoke 14. The power supply 24 also supplies a 60 Hz square wave clock signal via line 27 to the microprocessor 22.

Connected to the microprocessor 22 is a bus 28 for coupling the microprocessor 22 to an electrically alterable ROM (EAROM) 29 and a visual display device 30 which is preferably a 6-digit 7-segment LED display. The EAROM is a non-volatile memory 29 that is available for storing information that is changeable or changing and that must be retained in the event of loss of power. Typically, such information would include the content of the watt-hour register, the demand register and related time, times related to time of day or time of use periods, calibration constants, serial numbers, account numbers, security number, etc.

A power outage timer circuit 32 is coupled to the microprocessor 22 for timing any power outage that may occur and then supplying a signal, when power is restored after a power outage, to the microprocessor 22 which signal is indicative of the duration of the power outage so that the microprocessor 22 can update e.g., (correct) the real time value stored in the EAROM 29.

Optical meter reading circuitry 36 is provided coupled to the microprocessor 22 for facilitating rapid optical-electronic meter reading.

Finally, the microprocessor 22 has load control I/O ports, e.g., ports 41, 42 and 43, which are coupled to load control circuits, e.g., circuits 51, 52 and 53 for controlling energization of various consumer loads such as water heaters, air conditioners, electric heating, etc. The meter 10 can be programmed so that load control can be asserted by the customer/consumer or by the supplier/electric utility.

An override switch 60 is coupled to the microprocessor 22 and the load control circuits 51, 52, 53, etc. to enable the customer to override the load control function of the microprocessor 22. By operating the switch 60, e.g., during the day, the customer can energize his hot water heater overriding the microprocessor 22. Additionally, the microprocessor 22 and EAROM 29 are connected and programmed to reset the switch 60 to the open position thereof during the time (e.g., nighttime) of operation of the microprocessor 22 when it sends an energizing signal to the control circuitry, e.g., circuit 53 to energize the load if the switch 60 previously had been operated (closed) by the customer.

The yoke 14 has a voltage core 62 on which is mounted a voltage coil 64 connected across the consumer voltage supply lines. The yoke further has two current cores 66 and 67 each having thereon one conductor loop(s) 68, 69 of the respective first and second lines of a single phase power supply system to the consumer.

In accordance with the teachings of the present invention, the power supply coil 26 is mounted on the voltage core 62 above the voltage coil 64 and away from the induction disk 16 to provide an inexpensive power supply coil 26 (or secondary winding) thereby eliminating the need for a power supply transformer, namely a transformer core and transformer primary winding of thousands of turns of fine wire, the major cost items of a power supply transformer.

Since a portion of a leakage flux field between the voltage coil 64 and the power supply coil 26 can intercept the disk and interfere with proper registration, the power supply coil 26 (or secondary winding) is kept up toward the top part of the yoke 14 to minimize such leakage.

Of course, the lag adjustments on the voltage core 62 can be adjusted to compensate for this leakage.

Moreover, if the position of the power supply coil 26 (or secondary winding) and the load thereon are properly adjusted, the leakage flux can function as the lag adjustment and may eliminate the need for auxiliary parts normally required in a meter sensor.

Further according to the teachings of the present invention the conventional timing gears rotated by the induction disk 16 are eliminated and in their place there is provided the electro-optical sensor 12. The sensor 12 includes a pair of series-connected light emitting diodes 71 and 72 which are situated on one side of the disk 16 and positioned to direct light through an arcuate slot 76 (FIG. 2) in the disk 16 as the disk 16 is rotating. On the other side of the disk 16 are first and second light sensing devices, 81 and 82, or photosensors, e.g., phototransistors, which are positioned to sense light passing through the slot 76 and generate electrical pulses which are supplied to the microprocessor 22. Both photosensors 81 and 82 sense light passing through respective ends 77 and 78 (FIG. 2) of the slot 76 when the disk 16 is in the position shown in FIG. 2.

This electro-optical sensor 12 makes use of a conventional induction disk system, the "electro" part of the sensor 12, which has demonstrated accuracy, long life reliability and low cost. The "optical" (and electronic) part of the system resides in the LED's 71, 72, the slot 76, the photosensitive devices 81 and 82 and disk motion (or direction) sensing and revolution counting circuit 90 (FIG. 2) which receives signals from input lines 18 and 20 connected to the photosensors 81 and 82.

Figure 2:
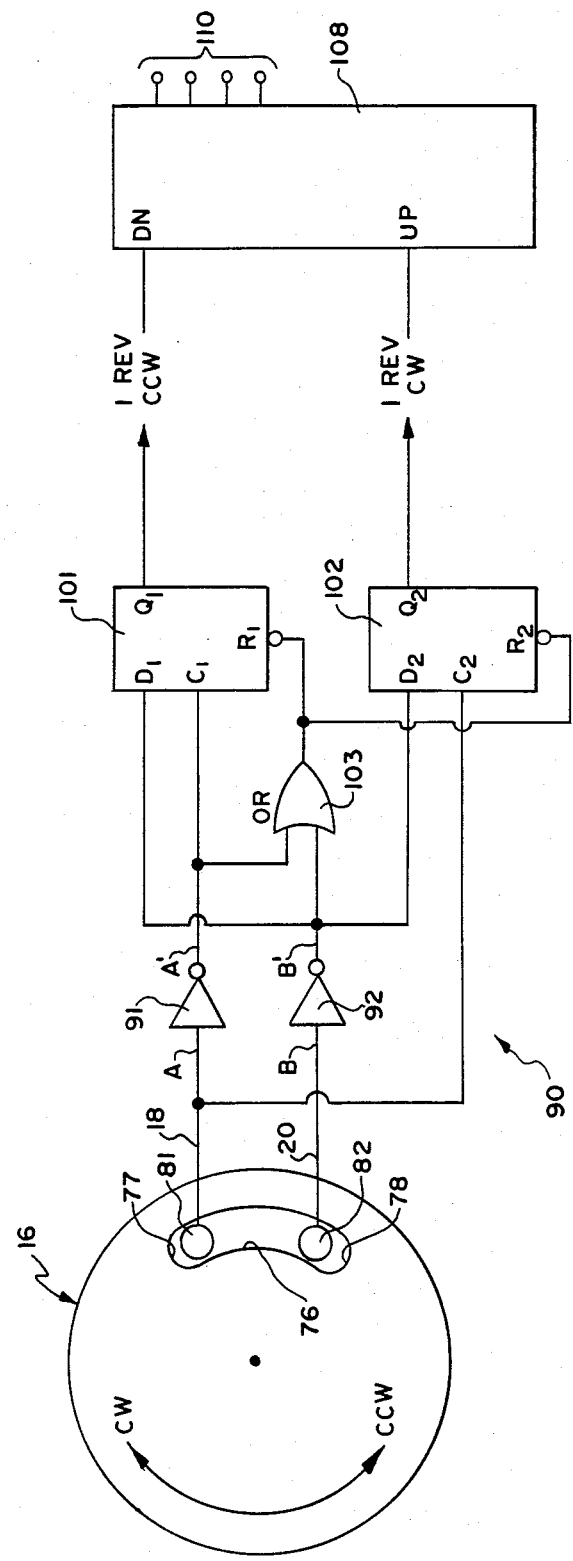
FIG. 2 is a schematic circuit diagram of a direction sensing circuit forming part of the electro-optical watt-hour sensor of the present invention, which circuitry is incorporated into the microprocessor shown in FIG. 1.

Referring now to FIG. 2 there is illustrated therein the disk 16 with the arcuate slot 76 therein positioned beneath the photosensors 81 and 82 such that the photosensor 81 is at the end 77 of the slot 76 and the photosensor 82 is at the end 78 of the slot 76. In this position, light is received through both ends 77 and 78 of the slot 76 and impinges upon the photosensors 81 and 82 thereby supplying a logic 1 signal on lines 18 and 20 to the inputs A and B of inverting amplifiers 91 and 92. The logic 1's are then converted at the outputs A' and B' of the inverting amplifiers 91 and 92 to logic 0's. The logic 0 at A' is supplied to the clock input $C_1$ of a rising edge triggered flip flop 101. The logic 0 at output B' is supplied to a data input $D_2$ of a second rising edge triggered flip flop 102. Typically, the rising edge triggered flip flops 101 and 102 are each realized by ½ of a 7474 edge triggered flip flop each of which has a data input $D_1$ or $D_2$, an output $Q_1$ or $Q_2$ and an active low reset $R_1$ or $R_2$.

The A' output of the inverting amplifier 91 is also supplied to one input of an OR gate 103.

The B' output of the inverting amplifier 92 is also supplied to an input of the OR gate 103.

At the particular point in time illustrated in FIG. 2 with logic 0's at A' and B', the output of the OR gate 103 is a logic 0 which is supplied to the resets $R_1$ and $R_2$.

The logic 1 on the input line 18 supplied to the input A of the inverting amplifier 91 is also supplied to the clock input $C_2$ of the flip flop 102 as shown.

The $Q_1$ output from the rising edge triggered flip flop 101 is supplied to a down input DN of an up/down counter 108 and the $Q_2$ output of the flip flop 102 is supplied to an up input UP of the counter 108. Typically, the up/down counter 108 is a 74193 up/down counter which totalizes net clockwise revolutions and which is triggered on a rising edge signal at the down input DN or the up input UP.

The inverting amplifiers 91, 92, the OR gate 103 and flip flops 101 and 102 are connected in the circuit 90 so that one clockwise pulse is produced by the flop flop 102 when the photosensor 82 is blocked by the disk 16 and the end 78 of the slot 76 uncovers photosensor 81 such that a logic 0 is supplied to the B input resulting in a logic 1 at the B' output and a rising edge signal (logic 0 to logic 1) is generated at the A input by the movement of the slot 76, namely the end 78 thereof, over the photosensor 81 on a clockwise rotation of the disk 16.

The flip flop 101 produces a counterclockwise output signal at the $Q_1$ output that is supplied to the down input DN of the counter 108 when a falling edge of the signal (logic 1 to logic 0) at the A input to the inverting amplifier 81 occurs creating a rising edge signal (logic 0 to logic 1) at clock input $C_1$ while the photosensor 82 is covered such that there is a logic 0 at the B input of the inverting amplifier 92 to establish a logic 1 input to OR gate 103 so resets $R_1$ and $R_2$ are at logic 1.

Counting is inhibited when light is sensed by the photosensor 82 and a logic 1 signal is supplied to the B input of the inverting amplifier 92. This prevents false counts from any jiggling or oscillation that may occur when the slot 76, namely the end 78 or 77 thereof, has partially uncovered one or both of the photosensors 81 or 82. If desired, additional slots similar to the slot 76 can be provided.

Also it is important to note that the signal at the output $Q_1$ or $Q_2$ of the flip flops 101 and 102 cannot change unless there is a rising edge signal at the clock input $C_1$ or $C_2$ which then transfers the logic signal at the data inputs $D_1$ or $D_2$ to the output $Q_1$ or $Q_2$. The output $Q_1$ or $Q_2$ is also changed or reset to 0 when there is a logic 1 supplied to the reset $R_1$ or $R_2$.

In illustrating how circuit 90 functions to count clockwise rotations and to subtract counterclockwise rotations, set forth below are the different logic values at different positions of the disk 16 and slot 76 therein relative to the photosensors 81 and 82 as the disk 16 rotates clockwise.

| I. Photosensors 81 and 82 covered by disk 16. | | | | | | |
|---|---|---|---|---|---|---|
| A | A' | $R_1$ | $C_1$ | $D_1$ | $Q_1$ | (On counterclockwise rotation |
| 0 | 1 | 1 | 1 | 1 | 0 | of disk 16, $Q_1 = 1 = 1$ down |
| B | B' | $R_2$ | $C_2$ | $D_2$ | $Q_2$ | count to counter 108) |
| 0 | 1 | 1 | 0 | 1 | 0 | |
| II. Photosensor 81 uncovered and photosensor 82 covered. | | | | | | |
| A | A' | $R_1$ | $C_1$ | $D_1$ | $Q_1$ | (On counterclockwise rotation |
| 1 | 0 | 1 | 0 | 1 | 0 | of disk 16, $Q_2 = 0$) |
| B | B' | $R_2$ | $C_2$ | $D_2$ | $Q_2$ | |
| 0 | 1 | 1 | 1 | 1 | 1 | = 1 up to counter 108 |
| III. Photosensors 81 and 82 uncovered. | | | | | | |
| A | A' | $R_1$ | $C_1$ | $D_1$ | $Q_1$ | |
| 1 | 0 | 0 | 0 | 0 | 0 | |
| B | B' | $R_2$ | $C_2$ | $D_2$ | $Q_2$ | |
| 1 | 0 | 0 | 1 | 0 | 0 | |
| IV. Photosensor 81 covered and photosensor 82 uncovered. | | | | | | |
| A | A' | $R_1$ | $C_1$ | $D_1$ | $Q_1$ | |
| 0 | 1 | 1 | 1 | 0 | 0 | |
| B | B' | $R_2$ | $C_2$ | $D_2$ | $Q_2$ | |
| 1 | 0 | 1 | 0 | 0 | 0 | |
| V. Photosensors 81 and 82 covered by disk 16. | | | | | | |
| A | A' | $R_1$ | $C_1$ | $D_1$ | $Q_1$ | |
| 0 | 1 | 1 | 1 | 1 | 0 | |
| B | B' | $R_2$ | $C_2$ | $D_2$ | $Q_2$ | |
| 0 | 1 | 1 | 0 | 1 | 0 | |

Conditions I through V set forth above describe the various logic conditions that occur as the disk 16 rotates clockwise from a position covering both photosensors 81 and 82 (condition I) through a position where both photosensor 81 and 82 are uncovered by the slot 76 (condition (III) and then to a position where both photosensors 81 and 82 are again covered by the disk 16 (condition V).

It will be seen that starting with condition I where both photosensors 81 and 82 are covered there is a logic 0 at the $Q_1$ output and a logic 0 at the $Q_2$ output. Now when photosensor 81 is uncovered and photosensor 82 is still covered, the logic value at the clock input $C_2$ goes from logic 0 to logic 1. At the same time, there is supplied a logic 1 to the data input $D_2$ which is transferred to the output $Q_2$ by reason of the rising edge signal (logic 0 to logic 1) at the clock input $C_2$ causing the $Q_2$ output to go from logic 0 to logic 1. This rising edge signal from logic 0 in condition I to logic 1 in condition II at the $Q_2$ output causes the inputting of a count (or rising edge signal) in the UP input of the counter 108. Then, when both photosensors 81 and 82 are uncovered (condition III) there is a reset input of logic 0 which resets the $Q_1$ and $Q_2$ inputs to 0. Also at this time both clock inputs $C_1$ and $C_2$ are at logic 0 and both data inputs are at logic 0 thereby ensuring a logic 0 at the outputs $Q_1$ and $Q_2$.

Now, in condition IV, when photosensor 81 is covered and photosensor 82 is uncovered, the value of the signal at the clock input $C_1$ goes from logic 0 to logic 1, a rising edge. However, the data input is at logic 0 so the signal at $Q_1$ remains at logic 0.

Then, when photosensors 81 and 82 are both covered again, (condition V) by the disk 16, the signal at clock input $C_2$ remains at 0 as it was in conditions III and IV and the signal at the clock input $C_1$ stays at logic 1 with no transfer of the signal at the data input $D_1$ to $Q_1$. Thus, the signal at outputs $Q_1$ and $Q_2$ remain at logic 0.

It will be appreciated that if the disk 16 is jiggled while the slot 76 is over the photosensors 81 and 82 so as to go from condition II to condition I, there is a rising edge signal (logic 0 to logic 1) at the clock input $C_1$ and the logic 1 at the data input $D_1$ is transferred to the output $Q_1$ and a rising edge (logic 0 to logic 1) is generated resulting in the inputting of a down count at the down input DN of the counter 108.

Also going backward or counterclockwise from condition V to condition I, it will be noted that in going from condition V to condition IV there is no reset signal (no logic 0 at $R_1$ or $R_2$) and there is no rising edge at the clock inputs $C_1$ or $C_2$, clock input $C_2$ remaining at logic 0 and clock input $C_1$ remaining at logic 1. Then, in going from condition IV to condition III, there is a falling edge signal at clock input $C_1$ (logic 1 to logic 0) and a rising edge signal (logic 0 to logic 1) at clock input $C_2$. Also at this time there is a reset signal of logic 0 which serves to reset the signal at outputs $Q_1$ and $Q_2$ to logic 0. Thus, although the signal at clock input $C_2$ is a rising edge signal (logic 0 to logic 1), data input $D_2$ is at logic 0 so as to transfer only a logic 0 from data input $D_2$ to output $Q_2$. Additionally, the logic 0 reset signal at reset $R_2$ forces $Q_2$ to 0.

Then, in going from condition III to condition II the signal at clock input $C_2$ remains at 0 resulting in no change in the signal at output $Q_2$.

The signal at clock input $C_1$ remains at logic 0 resulting in no change in the signal at output $Q_1$.

Now, in going from condition II to condition I, a rising edge signal is generated at clock input $C_1$ (logic 0 to logic 1). At the same time, there is a logic 1 signal at the data input $D_1$ which is then transferred to the output $Q_1$ and a rising edge signal to the DN input to counter 108 resulting in the inputting of one downcount or reverse rotation count into counter 108.

The circuit 90 is shown in FIG. 2 as a separate circuit. Data on the outputs 110 from the counter 108 is then supplied to the microprocessor 22. However, in the preferred embodiment, the circuit 90 is incorporated into and forms part of the microprocessor 22.

The counts of clockwise revolutions are indicative of the watt-hours consumed by the consumer and are processed by the microprocessor 22, i.e., stored in EAROM 29.

Except for the sensor 12, the meter 10 is very similar to the Solid State Watt-Hour Meter disclosed in copending application Ser. No. 303,627 filed on Sept. 18, 1981, the disclosure of which is incorporated herein by reference.

The meter 10 has no battery and derives its time from the power line, namely the 60 Hz clock signal. Since the meter 10 must accurately keep real time to support its time-of-day functions, loss of electrical power to the meter 10 would destroy the time-of-day functions. To keep time without system voltage, the power outage timer circuit 32 is included in the meter 10.

The timer circuit 32 is based on an R-C network, comprising resistor 112 connected across capacitor 114, where the recharge time is proportional to the outage time. If the recharge time indicates the outage has been greater than 6 hours then the time is not recoverable and default conditions must be used. In that case, the corrected time in the meter 10 is reloaded during the next meter reading operation by a meter reading unit.

As shown in FIG. 1, the power outage timer circuit 32 has other components which will now be described and is one of several timer circuits that can be used, such other timer circuits being of the type disclosed in copending application Ser. No. 303,599 filed Sept. 18, 1981 entitled: Power Outage Timer, the disclosure of which is incorporated herein by reference.

The timer circuit 32 has a voltage supply line 116 from the microprocessor 22 which charges the capacitor 114 through a diode 118 and resistor 120 to a voltage level at junction 122 related to the voltage supply. The voltage at junction 122 is coupled to one input of a comparator 123. Another voltage supply line 124 from the microprocessor 22 supplies a voltage through a diode 125 to voltage divider resistors 126 and 127. A point (junction) 128 in the divider resistors 126 and 127 is coupled to another input of the comparator 123 and has a normal voltage which is equal to or slightly less than the normal voltage on the capacitor 114. The output of the comparator 123 is connected to the microprocessor 22.

After a power outage, the time from the reestablishment of the A.C. supply voltage to the time the voltage at junction 122 equals or exceeds the voltage at point 128 is converted by the microprocessor 22 to the real time elapsed and added to the real time value in the EAROM 29 to correct the real time value therein.

A meter reading unit (not shown) particularly adapted for use with the meter 10 is provided with an optical plug, terminal or wand which is adapted to be placed over the I/O ports of the meter 10 behind which is located the optical meter reading circuitry 36 which includes a phototransistor 132 and an LED 134. Inside the unit is a microprocessor and associated computer components to form a microprocessor system which includes an optical input/output pair identical to the input/output pair 132 and 134 coupled by fiber optics to the wand.

An important feature of the meter 10 is the optical coupling available with the meter reading unit which is effected by placing the wand over the I/O ports. Communication can then take place optically such that the large amount of information which can be generated by the meter 10 can be quickly read by the meter reading unit 40.

After the meter 10 is installed, the microprocessor 22 is designed to restart after power outages and to be operating properly within about three seconds. The arrival of A.C. power starts the power supply 24 by energizing coil 26 to cause the microprocessor 22 to initialize itself and all related functions by calling data from its ROM and EAROM 29. It also counts each restart operation as part of a power theft detection means.

One of the last steps in initialization is for the microprocessor 22 to note the voltage at the output of the comparator 123 that senses the voltage on timer capacitor 114. The microprocessor 22 then causes the capacitor 114 to charge in such a way that the comparator's output voltage will change when its threshold voltage at point 128 is crossed. The time to this change is measured. From this time, the duration of the outage is calculated. If the calculated outage exceeds 6 hours, the microprocessor 22 then calls for a default condition rather than trying to establish an undependable time.

The microprocessor 22 performs several interrupt routines, one of which is: Watthour Pulse Reception. Here, the microprocessor 22 watches for pulses from the counter 108 indicating that a fixed quantity of watt-hours has passed. The software can track pulses at a rate up to 133 pulses per second, as well as apply a preselected calibration factor. These features permit a large variation in manufacturing variations of the watt-hour sensor 12.

Another interrupt routine is: Three Millisecond Timer. Every three milliseconds, the microprocessor checks to determine if (1) a sixty Hertz (60 Hz) square wave has changed polarity for keeping up the real time clock or (2) the phototransistor 132 has changed state to note if a communication effort with the meter 10 has been started. Further, the three millisecond clock is used to control the timing of the display function on display 30.

The third interrupt routine is: Main Task Loop. The key task of the meter 10 is to count watt-hours into the proper time-of-use register. The meter 10 will also calculate peak demands on a 15-minute running average and the time of the peak demand for each time-of-use period. The meter 10 must keep an accurate time-of-day clock to do these calculations. The Main Task Loop also controls the information that is kept in the EAROM 29 to ensure that no important information is lost on a loss of voltage situation. This function of the meter 10 also controls the data that is to be presented on the display 30.

From the foregoing description it is apparent that the electronic watt-hour meter 10 of the present invention has a number of advantages some of which have been described above and others of which are inherent in the invention. Also modifications can be made to the meter 10 without departing from the teachings of the invention. Accordingly the scope of the invention is only to be limited as necessitated by the accompanying claims.

We claim:

1. An electronic watt-hour meter, comprising: an electro-optical watt-hour sensor, adapted to be coupled to a consumer's connection to a source of electric power, for sensing the voltage supplied to and the current drawn by the consumer's electric load and for producing output signals indicative of a quantity of watt-hours of power utilized by the consumer; and power supply means for supplying D.C. power to said electro-optical watt-hour sensor from said consumer's connection, said electro-optical sensor comprising
  a yoke having a voltage core and at least one current core,
  an induction disk which is mounted for rotation on said yoke and which has at least one aperture therein,
  a voltage coil on said voltage core and a current loop on said at least one current core for causing, when energized, rotation of said induction disk,
  light generating means on one side of said disk, said light generating means comprising first and second light emitting devices,
  light receiving means, on the other side of said disk, for generating an output signal in response to light passing through said aperture, said light receiving means comprising discrete first and second photosensors and,
  direction sensing means, coupled to said light receiving means, for sensing the direction of rotation of said disk, said direction sensing means comprising
  an up/down counter for counting revolutions of said induction disk, said up/down counter having a down input, an up input and outputs for indicating the quantity of electrical power consumed over an interval of time,
  a first rising edge triggered flip flop having its output coupled to said down input of said up/down counter,
  a second rising edge triggered flip flop having its output coupled to said up input of said counter and its clock input coupled to the output of said first photosensor,
  a first inverting amplifier having its output coupled to the clock input of said first flip flop and its input coupled to the output of said first photosensor,
  a second inverting amplifier having its input coupled to said second photosensor and its output coupled to the data input of said first flip flop and to the data input of said second flip flop, and
  a NOR gate having a first input coupled to the output of said first inverting amplifier, a second input coupled to the output of said second inverting amplifier and an output coupled to the reset inputs of each of said flip flops.

2. The electronic watt-hour meter according to claim 1 wherein said power supply means include a power supply coil mounted on said yoke of said electro-optical sensor.

3. The electronic watt-hour meter according to claim 2 wherein said power supply coil is mounted on said voltage core.

4. The electronic watt-hour meter according to claim 1, further including:
  a microprocessor, coupled to said watt-hour sensor, for receiving said output signals;
  memory means, coupled to said microprocessor, for receiving and storing data supplied thereto;
  a voltage coil, carried by and electromagnetically coupled to said yoke, for supply power to said power supply means and to said microprocessor;
  clock signal generating means, coupled between the consumer line voltage and said microprocessor, for supplying a 60 Hz clock signal to said microprocessor; and
  readout means, coupled to said microprocessor and said direction sensing means, for providing a readout of the power consumed since the last reading of said electronic watt-hour meter.

* * * * *